United States Patent [19]

Kim et al.

[11] Patent Number: 5,396,463
[45] Date of Patent: Mar. 7, 1995

[54] DATA OUTPUT CIRCUIT OF A SEMICONDUCTOR MEMORY DEVICE

[76] Inventors: Young-Rae Kim, Hanbomido Apt. 503-204, Banpo-dong, Seocho-ku; Yun-Sang Lee, No. 194, Pilwoon-dong, Jongro-ku, both of Seoul, Rep. of Korea

[21] Appl. No.: 973,690

[22] Filed: Nov. 9, 1992

[30] Foreign Application Priority Data

Jan. 30, 1992 [KR] Rep. of Korea .................. 1992-1394

[51] Int. Cl.$^6$ ............................................. G11C 7/00
[52] U.S. Cl. ........................ 365/189.11; 365/189.05; 365/189.09; 365/202; 365/203
[58] Field of Search ................... 365/189.11, 189.09, 365/189.05, 202, 203; 307/450, 451

[56] References Cited

U.S. PATENT DOCUMENTS 4,894,803  1/1990  Aizaki .................................. 365/203

Primary Examiner—Eugene R. LaRoche
Assistant Examiner—Huan Hoang
Attorney, Agent, or Firm—Hecker & Harriman

[57] ABSTRACT

A data output circuit of a semiconductor memory circuit with pull-up and pull-down transistors for outputting data through complementary switching operation, comprising a pre-charge means for pre-charging a pair of data signals read from a memory cell having a given voltage level in a first operational mode, a switching means for connecting the output signal of the pre-charge means amplified to the gates of the pull-up and pull-down transistors, and an enable circuit for connecting the output signal of the switching means to the gates of the pull-up and pull-down transistors in a second operational mode. The switching means is a level change circuit to control the pull-up and pull-down transistors, which are data output drivers, by employing a constant voltage source to provide a voltage rise Vpp increased over the source voltage level Vcc of an integrated circuit before enabling the integrated circuit. The first and second operational mode respectively represent the disabling and enabling of the data output circuit to output the data.

6 Claims, 3 Drawing Sheets

DATA OUTPUT CIRCUIT OF A SEMICONDUCTOR MEMORY DEVICE

BACKGROUND OF THE INVENTION

1. Field of the Invention

The present invention relates to semiconductor memory devices, and more particularly to a data output circuit for outputting data read from memory cells.

2. Background Art

Since a semiconductor memory device is developed having high density and large capacity, it is necessary to increase the operational speed of the memory device when implemented in an integrated circuit. To this end, the integrated circuit is provided with a voltage increase circuit, a voltage pumping circuit, in order to produce a voltage rise Vpp that is greater than the source voltage when the operational voltage of the integrated circuit becomes low. Also, the integrated circuit is provided with an equalizer or pre-charge circuit to speed up the enabling of data signals. As is well-known in the art, achieving high speed data access depends significantly on the operational speed of the data output circuit (which comprises a data output buffer and a data output driver) for outputting the data read from the memory cells and for sensing data from the memory cells. The data output circuit outputs the data read from the memory cells to a system of high impedance external to the integrated circuit. Therefore, a transistor of the data output driver should have a larger channel size than transistors of the other circuits in order to increase the voltage level of the data to be ready for the large loading of a Dout Pin. In this case, the voltage level of the signal controlling the data output driver should be large enough to drive a transistor having a large channel.

A conventional data output circuit shown in FIG. 1 comprises input means 1-4 connected to data buses DB and DBB, output means 21 and 22 consisting of pull-up and pull-down transistors, pull-up control circuit 5-18 for controlling a pull-up transistor 21, and pull-down control circuit 19-20 for controlling the pull-down transistor 22. The pull-up and pull-down control circuits are controlled by a signal PITRST for enabling the output of the data output circuit. In the pull-up control circuit 5-18, a first capacitor 7 with one electrode connected to the output terminal of the first NAND gate 5 pumps up the voltage level of node n1, pre-charged at a voltage level of Vcc-Vth, to a higher level than the pre-charge voltage level when enabling the integrated circuit. A second capacitor 13 with one electrode connected via an inverter 12 to the output of the first NAND gate 5 pumps up the voltage level of node n2, pre-charged at a voltage level of Vcc-Vth, to a higher level than the pre-charge voltage level when outputting data during the enabling of the integrated circuit.

During operation of the conventional circuit shown in FIG. 1, the output data Dout of the data output circuit maintains a tri-state level provided by the system external to the integrated circuit in order to prevent the accessing of invalid data. In addition, the Dout pin or pad of the integrated circuit causes large self-loading, therefore, the sizes of pull-up and pull-down transistors 21 and 22 are made considerably larger than those of the other transistors. The pull-up control circuit 5-18 is provided with first and second pumping capacitors 7 and 13 comprising MOS transistors as shown in FIG. 1 in order to sufficiently drive the pull-up transistor having large channel size. Node n1 is respectively pre-charged between voltage levels Vcc-Vth and Vcc+2 Vth by means of the NMOS transistor when the integrated circuit is powered up and enabled. Node n2 is pre-charged to the Vcc-Vth level by means of NMOS transistor 16 when the integrated circuit is powered up. Node n2 is pre-charged to a full Vcc level by means of the fully turned-on NMOS transistor 15 when the integrated circuit is enabled. Two NMOS transistors 10 and 11 having channels connected in series form a clamper device designed to keep the voltage of node n1 to the Vcc+2 Vth level.

Hence, when data signal DBB is in a logical low level and the signal PITRST is in a logical high level, the output signal of the first NAND gate 5 becomes logical low. The coupling of capacitor 7 causes the voltage level of node n1 to drop down from the Vcc+2 Vth level turning off the channel of NMOS transistor 15. The logical high level output signal of inverter 12 causes the coupling effect of the second capacitor 13 to raise the voltage level of node n2 up to 2 Vcc. The logical low signal of the first NAND gate 5 turns on PMOS transistor 17 and then the pull-up transistor 21 in order to output the high level data from the integrated circuit. However, when data signal DB is logical low level, the pull-up transistor 21 is turned off and the pull-down transistor 22 turned on so as to output the low level data from the integrated circuit.

The circuit shown in FIG. 1 has several disadvantages. Capacitors consisting of MOS transistors are used to pump up voltage levels, therefore, an abrupt rise in voltage can destroy the junctions of the capacitors. The layout area occupied by a MOS capacitor is considerably larger than other devices, thus making it difficult to achieve high density. The pumped up voltage requires a circuit such as keeper to maintain a constant voltage level. Further, when the output Dout of the circuit shown in FIG. 1 is in the tri-state, the gate voltages of pull-up and pull-down transistors 21 and 22 should be in logical low level in order to turn off the transistors, and nodes n1 and n2 should be pre-charged with the voltage level Vcc-Vth. Consequently, a transistor (i.e., PMOS transistor 17) is required for properly-switching pull-up and pull-down transistors 21 and 22, thereby impairing the operational speed.

SUMMARY OF THE INVENTION

It is an object of the present invention to provide a data output circuit for stabilizing the operation of a semiconductor memory device.

It is another object of the present invention to provide a data output circuit which simplifies the design and layout of an integrated circuit so as to achieve high density.

It is a further object of the present invention to provide a data output circuit which is compact and minimizes power consumption.

It is a further object of the present invention to provide a data output circuit to highly increase the operational speed.

According to the present invention, a data output circuit of a semiconductor memory chip with pull-up and pull-down transistors for outputting data through complementary switching operation comprises a pre-charge means for pre-charging a pair of data signals read from a memory cell with a given voltage level in a first operational mode, a switching means for connecting the output signal of the pre-charge means amplified to the gates of the pull-up and pull-down transistors, and an enable circuit for connecting the output signal of the switching means to the gates of the pull-up and pull-down transistors in a second operational mode.

The switching means is a level change circuit to control the pull-up and pull-down transistors, which are data output drivers, by employing a static voltage source to provide a voltage rise Vpp increased over the source voltage level Vcc of the integrated circuit before enabling the integrated circuit. The first and second operational mode respectively represent the disabling and enabling of the data output circuit to output data.

BRIEF DESCRIPTION OF THE DRAWINGS

For a better understanding of the invention, and to show how the same may be carried into effect, reference will now be made, by way of example, to the accompanying diagrammatic drawings, in which.

DETAILED DESCRIPTION OF THE PRESENT INVENTION

Figure 1:
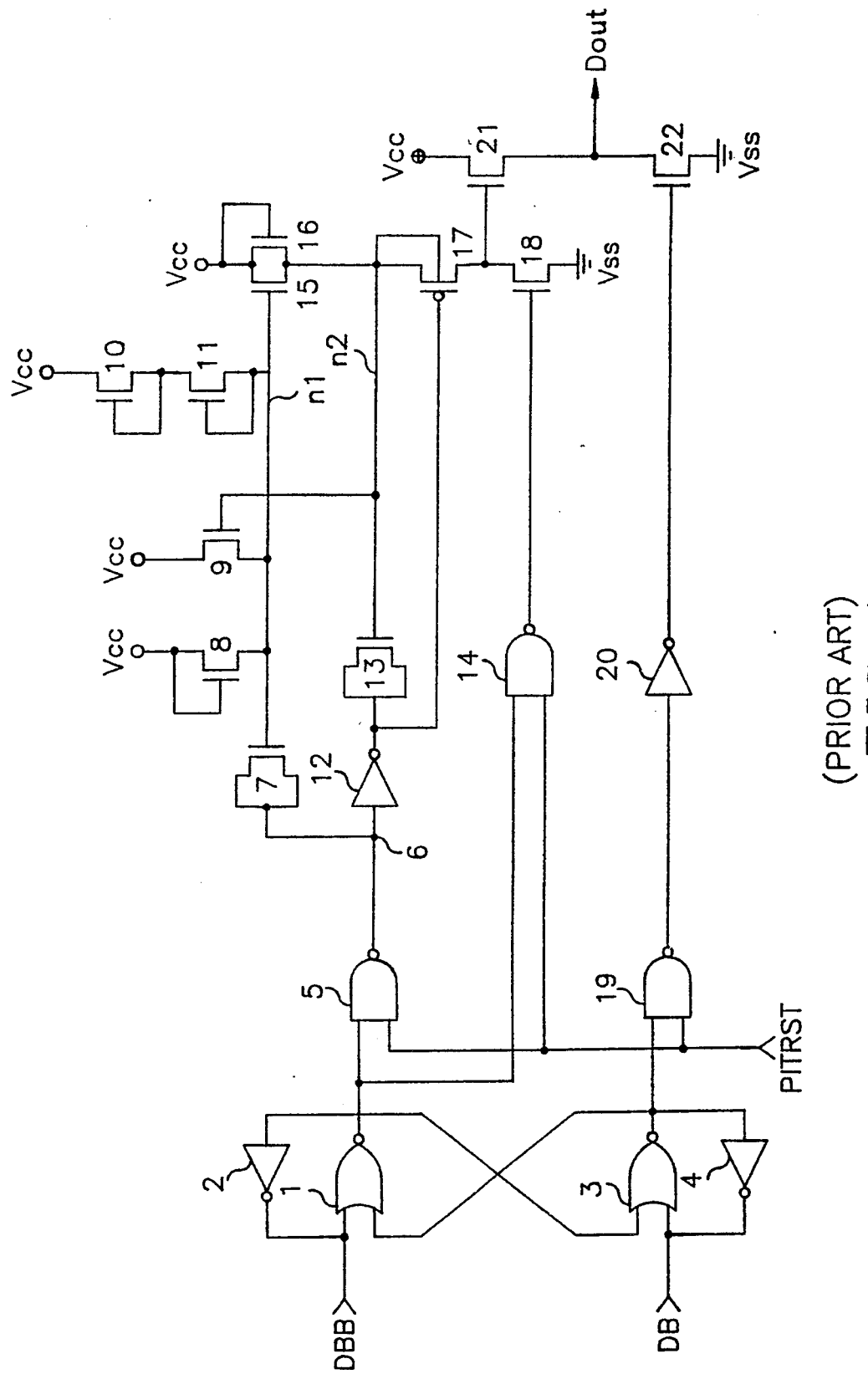
FIG. 1 is a schematic diagram of a conventional data output circuit.
Figure 2:
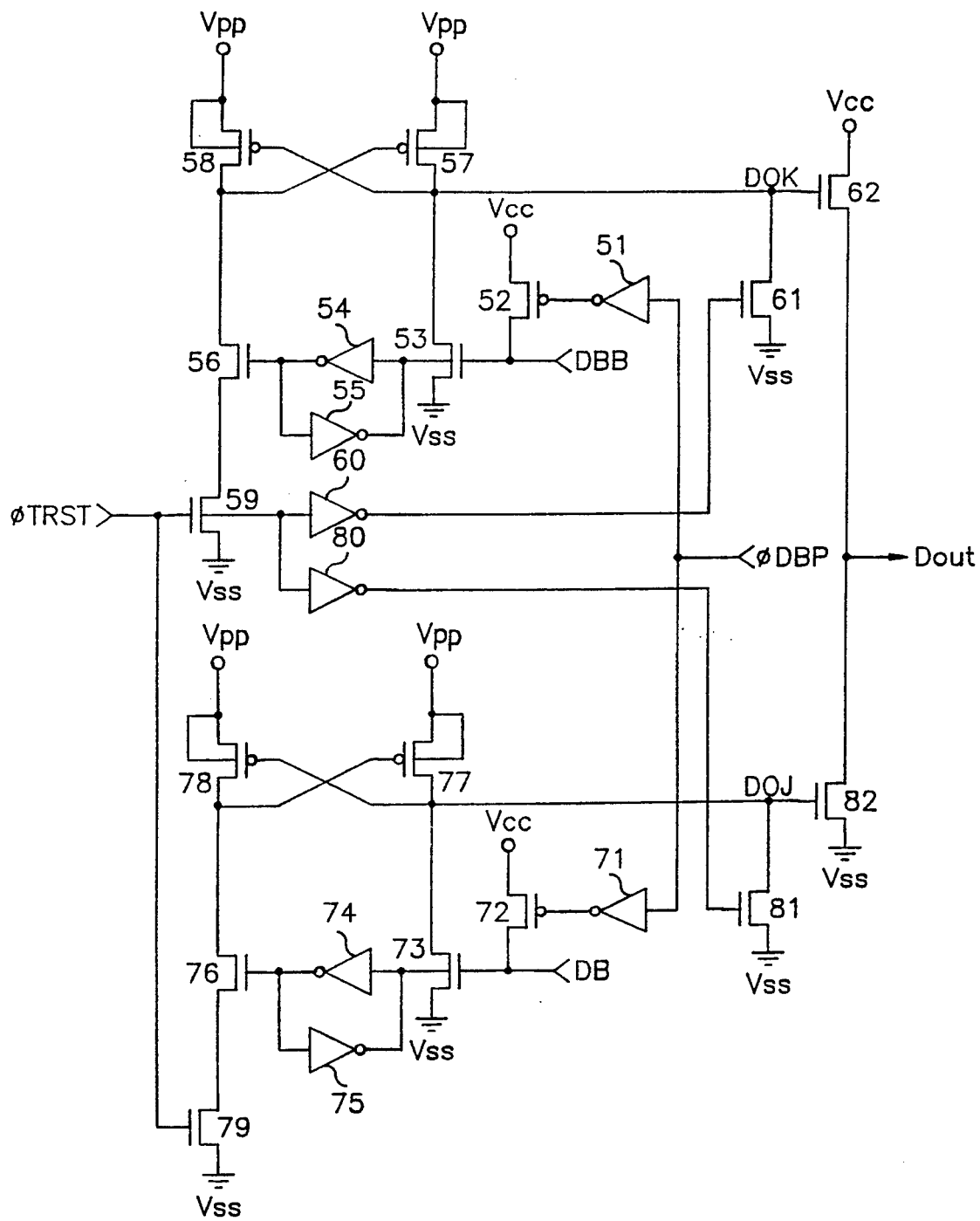
FIG. 2 is a schematic diagram of an inventive data output circuit.

Referring to FIG. 2, a first and second pre-charge means 51–52 and 71–72 respectively pre-charge a pair of data signals DBB and DB read from memory cells to the source voltage level for disabling the data output. A first and second switching means 53–58 and 73–78 respectively amplify and connect the output signals of the first and second pre-charge means 51–52 and 71–72 to the gates of the pull-up and pull-down transistors 62 and 82. A first and second enable circuits 59–61 and 79–81 respectively connect the output signal of the first and second switching means 53–58 and 73–78 to the gates of pull-up and pull-down transistors 62 and 82 enabling the data output.

The first and second pre-charge means 51–52 and 71–72 are driven by a control signal φDBP, and pre-charge the input level of the data signals DBB and DB using the source voltage Vcc in order to turn off pull-up and pull-down transistors 62 and 82 disabling the data output. The control signal φDBP is produced from an address transition detection circuit (ATD) provided in a memory chip to enable the data signals DBB and DB for outputting the data from the integrated circuit. Data signals DBB and DB are read from memory cells input to the data output circuit.

The first and second switching means 53–58 and 73–78 are well-known CVSL (cascade voltage switching logic) circuits. Each CVSL circuit comprises two PMOS transistors having gates connected to opposite drains in latch form and two NMOS transistors having channels connected in series respectively to the drains of the two PMOS transistors. A pair of signals with opposite phases respectively control the NMOS transistors in order to output the source voltage via the channel of one of the PMOS transistors having a gate-source voltage Vgs greater than that of the other. The first and second switching means convert the swing of the source voltage Vcc of the first and second pre-charge means into the swing of the voltage rise Vpp in order to respectively and fully control pull-up and pull-down transistors 62 and 82.

The present invention has several advantages over the prior art. The data output circuit does not require a MOS capacitor which was the case in prior art thereby stabilizing operation of the device. Also, removing the MOS capacitor makes the circuit more compact achieving high density and simplifying the design and layout of the circuit.

The first and second enable circuits 59–61 and 79–81 are driven by a control signal φTRST. The first and second enable circuits 59–61 and 79–81 produce the output signals DOK and DOJ to turn off the pull-up and pull-down transistors 62 and 82 disabling the data output and thereby maintaining the Dout in the tri-state level. The signal φTRST is produced after a given time when a column address strobe (CAS) signal transits to the active state.

Figure 3:
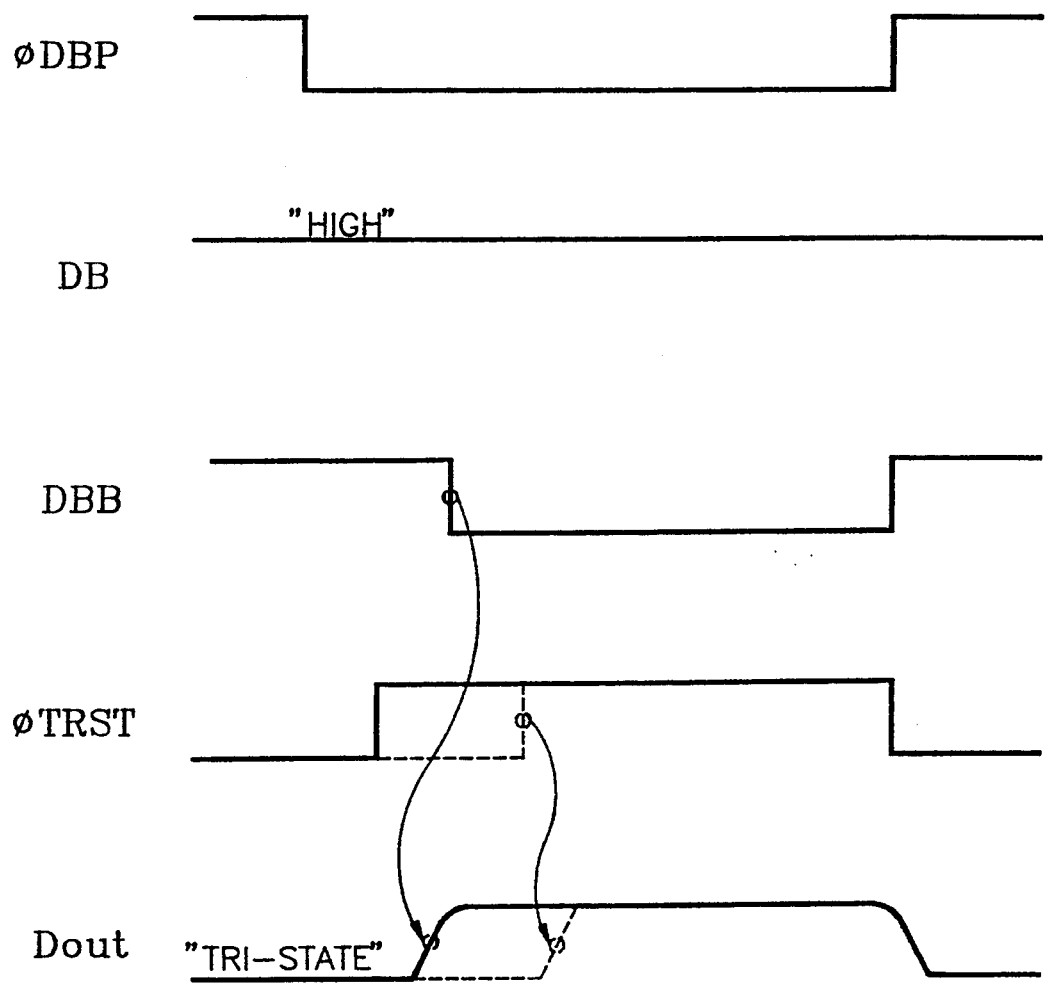
FIG. 3 is the operational timing diagram of FIG. 2.

The operational characteristics of the data output circuit will now be described with reference to FIG. 3 according to the present invention.

The data buses DB and DBB have opposite phases when data is read from memory cells. For example, if data read from the memory cells is in a logical high level, DB is logical high and DBB is logical low. Similarly, if the data is in a logical low level, DB is logical low and DBB is logical high. The signal φTRST is a master clock signal for controlling the data output circuit. The data signals DB (or DBB) and φTRST shown in FIG. 3 are produced in different order according to the input condition and are illustrated with dotted and solid lines. The data signals enable the signals DOK and DOJ to drive the data output circuit only when the two signals DB (or DBB) and φTRST are applied regardless of the input condition. The signals DB and DBB are pre-charged to the source voltage Vcc by controlling the signal φDBP. The signals DOK and DOJ are respectively pre-charged to 0 V of the ground voltage level Vss according to the signals φDBP and φTRST. For example, if the signal φDBP is logical low enabling the input of the signals DB and DBB, the data read from the memory cells is logical high to maintain the signal DB in logical high level and the input of the signal DBB is logical low level, then the second switching means 73–78 maintains the previous state to make the signal DOJ logical low.

NMOS transistors 53 and 56 of the first switching means 53–58 are respectively turned off and on and PMOS transistors 57 and 58 are respectively turned on and off, thus causing the signal DOK to be in the high level of the voltage rise Vpp. In this case, the signal φTRST becomes logical high to turn off NMOS transistors 61 and 81 enabling the signal DOK to a high level before or after the signal DBB becomes logical low. As a result, pull-up and pull-down transistors 62 and 82 are respectively turned on and off, thereby producing the output signal Dout having a high level. Likewise, if the signal φDBP becomes logical low to enable the input of the signals DB and DBB, the data read from the memory cells becomes logical low to maintain the high level of signal DBB and the low level of signal DB. Pull-up transistor 62 is turned off and pull-down transistor 82 is turned on so as to make the output signal Dout logical low.

Thus, the signals DB and DBB containing data read from the memory cells are transmitted with high speed through the gates and only the one channel of PMOS transistor 57 to the gates of pull-up and pull-down transistors 62 and 82. It is well-known in the art that data transmission is performed at much higher speeds through gates than through channels.

Furthermore, the voltage amplification of the input signals DB and DBB is performed not through voltage pumping, but through the level change obtained by the first and second switching means 53–58 and 73–78. This has the advantages of minimized power consumption and stabilized operation. In addition, the signals φDBP and φTRST are only connected to the constant voltage source Vpp and do not require a keeper circuit necessary in a conventional circuit.

Although the present invention has been described with reference to a preferred embodiment as shown in FIG. 2, it may be variously modified without departing from the scope of the present invention. For example, implementing the device by replacing PMOS transistors 52 and 72 of the first and second pre-charge means with NMOS transistors with consideration given to the logic.

While the invention has been shown in detail and described with reference to the preferred specific embodiment thereof, it will be apparent to any person skilled in the art that the foregoing changes in form and detail may be made without departing from the spirit and scope of the present invention.

We claim:

1. A data output circuit of a semiconductor memory circuit having pull-up and pull-down transistors for outputting data through complementary switching operation, comprising:
   pre-charge means for pre-charging a pair of data signals read from a memory cell up to a source voltage level in a first operational mode;
   switching means for amplifying and connecting an output signal of said pre-charge means to gates of said pull-up and pull-down transistors;
   an enable circuit for connecting an output signal of said switching means to said gates of said pull-up and pull-down transistors in a second operational mode;
   Wherein said switching means is a level change circuit for controlling said pull-up and pull-down transistors by employing a constant voltage source to provide a voltage rise (Vpp) increased over a said source voltage level before enabling data output.

2. A data output circuit as claimed in claim 1, wherein said first and second operational mode respectively represent the disabling and enabling of said data output circuit.

3. A data output circuit as claimed in claim 1, wherein said pre-charge means are driven by a control signal generated from an address transition circuit provided in said memory circuit, said control signal enabling said data signals read from said memory cell to be inputted to said data output circuit in a data output mode.

4. A data output circuit of a semiconductor memory circuit with pull-up and pull-down transistors to respectively receive through gates of said pull-up and pull-down transistors a pair of signals having complementary logic levels, comprising:
   first and second pre-charge means for respectively pre-charging input levels of a pair of data signals read from a memory cell up to a source voltage level in the disabling of data output;
   first and second switching means for respectively amplifying and connecting output signals of said first and second pre-charge means to said gates of said pull-up and pull-down transistors;
   first and second enable circuits for respectively connecting output signals of said first and second switching means to said gates of said pull-up and pull-down transistors in the enabling of the data output;
   wherein said first and second switching means are level change circuits for respectively controlling said pull-up and pull-down transistors by employing a constant voltage source to provide a voltage rise (Vpp) increased over said source voltage level before enabling data output.

5. A data output circuit as claimed in claim 4, wherein said first and second pre-charge means are driven by a control signal generated from an address transition circuit provided in said memory circuit, said control signal enabling said data signals read from said memory cell to be inputted to said data output circuit in a data output mode.

6. A data output circuit of a semiconductor memory circuit with pull-up and pull-down transistors to respectively receive through gates of said pull-up and pull-down transistors a pair of signals having complementary logic levels, comprising:
   first and second pre-charge means for respectively pre-charging input levels of a pair of data signals read from a memory cell up to a source voltage level in the disabling of data output;
   first and second switching means for respectively amplifying and connecting output signals of said first and second pre-charge means to said gates of said pull-up and pull-down transistors;
   first and second enable circuits for respectively connecting output signals of said first and second switching means to said gates of said pull-up and pull-down transistors in the enabling of the data output;
   wherein said first and second pre-charge means are driven by a control signal generated from an address transition circuit provided in said memory circuit, said control signal enabling said data signals read from said memory cell to be inputted to said data output circuit in a data output mode.

* * * * *